United States Patent [19]

David et al.

[11] 4,377,901
[45] Mar. 29, 1983

[54] METHOD OF MANUFACTURING SOLAR CELLS

[75] Inventors: Gerard-Robert David, Cambes-En-Plaine; Daniel M. Pinçon, Caen, both of France

[73] Assignee: U.S. Philips Corporation, New York, N.Y.

[21] Appl. No.: 268,454

[22] Filed: May 29, 1981

[30] Foreign Application Priority Data

Jun. 16, 1980 [FR] France ............................. 80 13321

[51] Int. Cl.³ ............................................. H01L 31/18
[52] U.S. Cl. ..................................... 29/572; 136/255; 148/188; 148/190
[58] Field of Search .................. 29/572; 148/187–190; 136/243, 255, 256, 261; 357/30

[56] References Cited

U.S. PATENT DOCUMENTS

| 4,104,091 | 8/1978 | Evans, Jr. et al. | 148/188 |
| 4,141,811 | 2/1979 | Yerkes et al. | 204/192 E |
| 4,158,591 | 6/1979 | Avery et al. | 156/643 |
| 4,199,377 | 4/1980 | Corwin et al. | 136/255 |

Primary Examiner—Aaron Weisstuch
Attorney, Agent, or Firm—Thomas A. Briody; Robert T. Mayer; Steven R. Biren

[57] ABSTRACT

A method of manufacturing solar cells in a semiconductor wafer uses a first doped glassy layer which is spaced apart from the edges of the wafer, in combination with a second undoped glassy layer, so that, when the dopants are diffused from the first layer into the wafer, only that portion of the wafer beneath the first layer is doped. This simple and economical method results in solar cells having improved leakage characteristics.

4 Claims, 5 Drawing Figures

METHOD OF MANUFACTURING SOLAR CELLS

BACKGROUND OF THE INVENTION

The invention relates to a method of manufacturing a solar cell with a semiconductor wafer comprising a region of a first conductivity type and having on its front radiation-incident side a first major surface and on its rear side a second major surface, having a first surface layer of a second conductivity type which adjoins the first major surface and which forms with said region the active p-n junction of the solar cell, and having a second surface layer of the first conductivity type adjoining the second major surface and having a higher doping concentration than that of said region, in which in order to form the second surface layer, a first glassy layer comprising a dopant determining the first conductivity type, and a second, undoped glassy layer are successively provided on the second major surface.

Such a method is known from U.S. Pat. No. 4,158,591.

It is known that the presence of a highly doped layer on the rear side of a plate of a solar cell, which layer is of the same conductivity type as the base material of the said plate, improves the performance of said cell considerably.

However, forming the highly doped layer complicates the process of manufacturing the cell, which disadvantage is associated on the one hand with manufacturing said layer and on the other hand with the necessity of cleaning the edge faces of the wafer, so as to eliminate any risk of electric leakage between the two layers of opposite conductivity types created on the front and rear sides of the wafer.

A known method of cleaning the edge face of a semiconductor wafer consists of using plasma etching. An example of performing said technique on a wafer of a solar cell is shown in the previously mentioned U.S. Pat. No. 4,158,591. According to this example, the wafers or "slices" which have parasitic p-n junctions on their side faces are stacked and introduced into the treatment chamber of a carbon fluoride plasma reactor, where they are left for a few minutes.

Such a treatment, although comparatively short in duration, requires great care complicates the manufacturing process and increases the manufacturing cost of said cells. Other known mechanical or mechanicochemical methods might also be used to produce the same effect. However, whatever the prior art method chosen, a special treatment is still required.

SUMMARY OF THE INVENTION

It is the object of the present invention to provide an improvement in the manufacturing process of a solar cell which avoids having to perform a special treatment on the edges of the wafer.

The invention is based on the idea that the best way of avoiding the etching of the edge face of the cell is to ensure that said edge face is not "contaminated" by parasitic junctions.

According to the invention, a method of manufacturing a solar cell as described in the opening paragraph of the present description is characterized in that the first glassy layer is provided spaced from the edges of the semiconductor wafer and that the second glassy layer covers the edges of the second major surface not covered by the first glassy layer and the edge faces of the semiconductor wafer.

As a result of the localization of the first deposit, the doping element of the first conductivity type cannot reach the edge faces during the subsequent diffusion treatment(s). On the other hand, the nondoped mask of glassy material formed by the second deposit forms a barrier to diffusion, through the edge face, of the dopant used to form the surface layer of the second conductivity type; this dopant can reach the edge faces only by internal migration from the front side, and this only over a small part of the thickness of the wafer. Due to the two combined depositions according to the invention, any interaction between the diffused p and n-layers on the edges of the wafer is avoided. A subsequent etching treatment of the edge face of said wafer is also not necessary, and it is the advantage of the method according to the invention to permit the formation of a layer overdoped on the side of the rear face of the cell without this addition necessitating the use of supplementary operational steps.

Advantageously, it is ensured that the first deposit extends only up to a point situated approximately between 1 and 2 mm from the edges of the wafer.

According to a first embodiment of the method according to the invention, the surface layer of the second conductivity type, at the base of which the junction is situated, is obtained in the usual manner by diffusion from the gaseous phase. So in this case the first and second deposits are formed on the rear side of the wafer, said wafer is then placed in a furnace in which the surface layer of the first conductivity type is formed simultaneously by diffusion of the doping element included in the first deposit, and the surface layer of the second conductivity type is formed by diffusion of an appropriate doping element contained in the atmosphere of the furnace.

According to another embodiment of the method according to the invention, the two surface layers are formed by diffusion of doping elements included in the deposits of a glassy substance. The operational method comprises the following steps: formation of the first and second deposits, then formation of a third deposit, on the front side of the wafer, of a glassy substance comprising at least a doping element of the second conductivity type, and then formation of a fourth deposit, on the said third deposit, of a glassy substance not comprising the doping element. The wafer which has received successively the four deposits is then subjected to a single thermal diffusion treatment during which the N+ and P+ surface layers are simultaneously formed.

BRIEF DESCRIPTION OF THE DRAWING

The invention will now be described in greater detail, by way of example, with reference to the accompanying drawings, in which.

DETAILED DESCRIPTION

Figure 1:
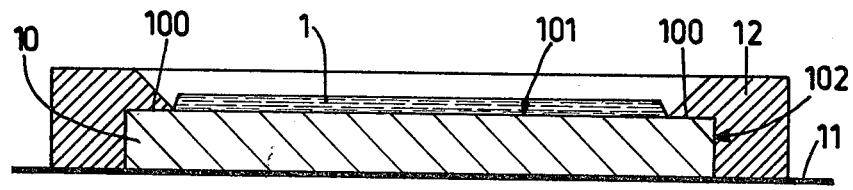
FIGS. 1 to 5 are diagrammatic sectional views of five stages of the manufacture of a solar cell according to the method of the invention.

The cell is formed on a wafer 10 of semiconductor material of a first conductivity type. In this example the wafer 10 is of silicon and initially it is P type doped throughout its thickness.

In a first step of the method according to the invention, the wafer 10, which is suitably prepared as regards the usual surface treatments and is disposed on a plate 11, is provided with a mask 12. Said mask 12, which also bears on the plate 11, covers a marginal band 100 of the rear face 101 of the wafer; it also covers the edge faces 102 of said wafer.

On the exposed part of the face 101 is formed a pyrolytic deposit of silicon oxide at low temperature. This deposit, first deposit 1, is obtained by a technique which is known to those skilled in the art and which consists of heating the wafer 10 at a temperature between 420° and 450° C. in a mixture of silane ($SiH_4$) and oxygen, with a doping element (or gaseous compound comprising such a doping element) if necessary. In the case of the deposit 1, there is a dopant of the first conductivity type, in this case boron hydride ($B_2H_6$). The thickness of the deposit 1 is between 0.2 and 0.5 $\mu$m. The wafer 10 provided with the deposit 1 on its face 101 is shown in FIG. 1.

Figure 2:
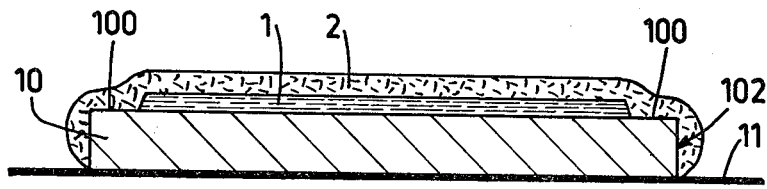

The second operational step after having removed the mask 12 consists of forming a second pyrolytic deposit 2 of silicon oxide without a doping element, according to the preceding technique. This deposit 2, such as provided by the invention, covers in addition to the deposit 1 the marginal band 100 left uncovered by the first deposit 1 as well as the edge face 102 of the wafer 10; its thickness is between 0.3 and 1 $\mu$m. The wafer in this stage of the manufacture of the cell is shown in FIG. 2.

Figure 3:
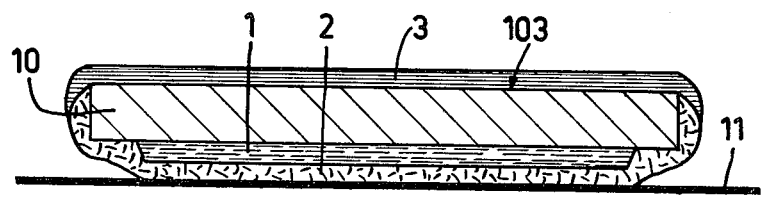

The following operational step, as shown in FIG. 3 consists of returning the wafer 10 to the plate 11 with face 103 exposed and depositing on the front face 103 a deposit 3, the third pyrolytic deposit of silicon oxide, which this time is doped with phosphine ($PH_3$). This deposit extends over the whole face 103 and brims over the second deposit 2, which is of no importance. Its thickness is between 0.2 and 0.5 $\mu$m.

Figure 4:
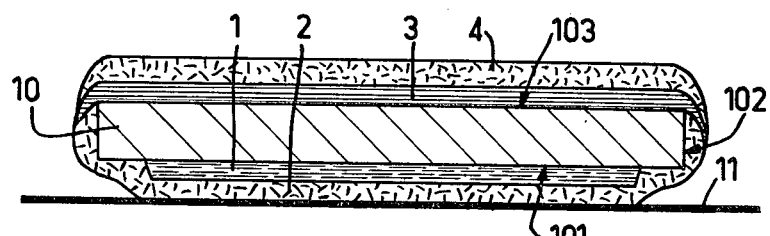

The deposit 3 is then covered with a deposit 4, the fourth pyrolytic deposit of silicon oxide, which at its edge extends up to the deposit 2 and which comprises no dopant. The thickness of deposit 4 is adjusted to between 0.3 and 1 $\mu$m. The wafer having four deposits of glassy material provided in any of the described forms of the process according to the invention is shown in FIG. 4.

The wafer thus prepared is subjected to a thermal treatment at a temperature of between 850° and 950° C. for 30 to 90 minutes, during which the boron of the first deposit and the phosphorus of the third deposit simultaneously diffuse into the silicon. In this manner are formed on the one hand the surface layer 13 of N+ conductivity on the front face 103, at the base of which layer 13 the p-n junction 14 is situated, and on the other hand the surface layer 15 of P+ conductivity on the rear face 101, which layer 15 is spaced from the edges of the wafer.

When the diffusion treatment is completed, the glassy deposits 1, 2, 3 and 4 are dissolved by dipping in a solution of hydrofluoric acid (HF).

Figure 5:
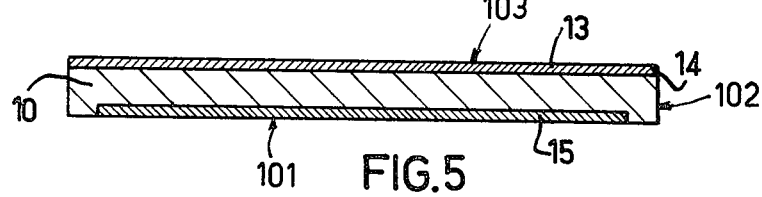

The wafer is then as shown in FIG. 5. Since the edge face 102 has been protected by the deposit 2 of pure pyrolytic silicon oxide, no parasitic diffusion has occurred at the edge face. Moreover, in order to avoid any risk of interference between the layers 13 and 15 in the vicinity of edge face 102 and thus to avoid having to apply an etching treatment to the edge face, it is advantageously arranged that the width of the marginal band 100 (see FIG. 1) is between 1 mm and 2 mm; this width takes into account the lateral diffusion depth of the p dopant.

Starting from a wafer as shown in FIG. 5, the cell may be completed by the deposition of contact pads and an anti-reflective layer.

According to another embodiment of the method, after the structure shown in FIG. 2 has been obtained, the semiconductor wafer with the glassy layers 1 and 2 and the exposed first major surface 103 is heated in a gas which contains a dopant of the second conductivity type, in this case, for example, a boron compound. The first surface layer 13 and the second surface layer 15 are formed simultaneously, also by diffusion.

It will be obvious that the method according to the invention, which in this example is applied to a wafer of p-conductivity type, may be extended without any modification other than that of the order of applying the doped deposits, to the treatment of a wafer being initially of n-conductivity type.

What is claimed is:

1. A method of manufacturing a solar cell comprising a semiconductor wafer having a region of a first conductivity type with a first major surface on its front radiation-incident side and a second major surface on its rear side, a first surface layer of a second conductivity type opposite to that of the first which adjoins said first major surface and forms with said region the active p-n junction of said solar cell, and a second surface layer of said first conductivity type which adjoins said second major surface and has a higher doping concentration than that of said region, which comprises:

providing a first glassy layer comprising a first dopant determinative of the first conductivity type on said second major surface and spaced apart from the edges of said semiconductor wafer; then providing a second undoped glassy layer on said first glassy layer and on the edge portions of said second major surface and the edges of said semiconductor wafer not covered by said first glassy layer; and then heating said semiconductor wafer while introducing a second dopant determinative of said second conductivity type into said first major surface, said second undoped glassy layer preventing the doping of said second major surface and said edges by said second dopant, while that portion of said second major surface beneath said first glassy layer is doped by said first dopant from said first glassy layer.

2. A method as claimed in claim 1 in which the said surface layers are obtained by diffusion, characterized in that, after providing the first and second glassy layers, the semiconductor wafer is heated, whereby simultaneously by diffusion from the gaseous phase the first surface layer, and by diffusion from the first glassy layer the second surface layer, are formed.

3. A method as claimed in claim 1, characterized in that, after providing the first and second glassy layers, a third glassy layer comprising a dopant determinative of the second conductivity type is provided on at least the whole first major surface, and on a fourth undoped glassy layer is then provided on at least the third glassy layer, after which the dopants are simultaneously indiffused.

4. A method as claimed in claims 1, 2 or 3 characterized in that the first glassy layer extends up to a distance of at least 1 mm and at most 2 mm from the edge of the semiconductor wafer.

* * * * *

UNITED STATES PATENT AND TRADEMARK OFFICE
CERTIFICATE OF CORRECTION

PATENT NO. : 4,377,901
DATED : March 29, 1983
INVENTOR(S) : Gerard-Robert David Et Al It is certified that error appears in the above—identified patent and that said Letters Patent is hereby corrected as shown below:

Col. 4, Claim 2, Line 1, after "1" insert --,--.

Col. 4, Claim 3, Line 5, Omit "on".

Col. 4, Claim 4, Line 1, after "3" insert --,--.

Signed and Sealed this

Seventh Day of June 1983

[SEAL]

Attest:

DONALD J. QUIGG

Attesting Officer     Acting Commissioner of Patents and Trademarks